United States Patent [19]
Hsiao et al.

[11] Patent Number: 6,107,155
[45] Date of Patent: Aug. 22, 2000

[54] METHOD FOR MAKING A MORE RELIABLE STORAGE CAPACITOR FOR DYNAMIC RANDOM ACCESS MEMORY (DRAM)

[75] Inventors: Yung-Kuan Hsiao, Hsinchu; Cheng-Ming Wu, Kao-Hsiung; Yu-Hua Lee, Hsinchu, all of Taiwan

[73] Assignee: Taiwan Semiconductor Manufacturing Company, Hsin-chu, Taiwan

[21] Appl. No.: 09/131,118

[22] Filed: Aug. 7, 1998

[51] Int. Cl.[7] .................................................. H01L 21/20
[52] U.S. Cl. ............................................ 438/397; 438/254
[58] Field of Search .................................. 438/396, 397, 438/253, 254, 634, 637, 638, 639, 647, 622

[56] References Cited

U.S. PATENT DOCUMENTS

| | | | |
|---|---|---|---|
| 5,281,549 | 1/1994 | Fazan et al. | 437/52 |
| 5,354,705 | 10/1994 | Matthews et al. | 437/52 |
| 5,405,796 | 4/1995 | Jones, Jr. | 437/47 |
| 5,478,772 | 12/1995 | Fazan | 437/60 |
| 5,759,892 | 6/1998 | Wang et al. | 438/254 |

*Primary Examiner*—David Nelms
*Assistant Examiner*—Quoc Hoang
*Attorney, Agent, or Firm*—George O. Saile; Stephen B. Ackerman

[57] ABSTRACT

A modified method for forming stacked capacitors for DRAMs which circumvents oxide erosion due to misalignment is described. A planar silicon oxide ($SiO_2$) first insulating layer is formed over device areas. First openings are etched for capacitor node contacts. A polysilicon layer is deposited and etched back to form node contacts in the first openings, which are generally recessed due to overetching to completely remove the polysilicon on the insulating surface. A $Si_3N_4$ etch-stop layer is deposited to protect the exposed sidewalls in the first openings. A disposable second $SiO_2$ insulating layer is deposited and second openings are etched over and to the node contacts for forming bottom electrodes. A conformal second polysilicon layer is deposited and chemically/mechanically polished back to form the bottom electrodes in the second openings. The second insulating layer is removed by wet etching to the etch-stop layer. When the second openings are misaligned over the node contact openings, the $Si_3N_4$ on the sidewalls protects the $SiO_2$ first insulating layer from being eroded over the devices on the substrate. The capacitors are now completed by forming an inter-electrode dielectric layer on the bottom electrodes, and depositing and patterning a third polysilicon layer for top electrodes.

18 Claims, 7 Drawing Sheets

METHOD FOR MAKING A MORE RELIABLE STORAGE CAPACITOR FOR DYNAMIC RANDOM ACCESS MEMORY (DRAM)

BACKGROUND OF THE INVENTION (1) Field of the Invention

The present invention relates to the fabrication of dynamic random access memory (DRAM) devices, and more particularly to a method for fabricating stacked storage capacitors for DRAM cells using an improved semiconductor process. Openings in a disposable insulating layer are used as a template for making capacitor bottom electrodes. This process eliminates erosion of an underlying insulating layer over the devices on the substrate when these openings are misaligned.

(2) Description of the Prior Art

Ultra Large Scale Integration (ULSI) technologies have dramatically increased the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the chip.

Figure 1A:
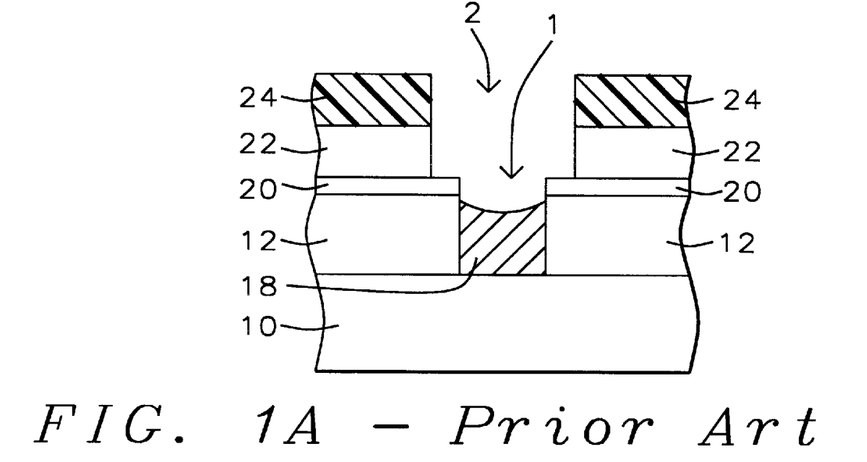
Figure 1B:
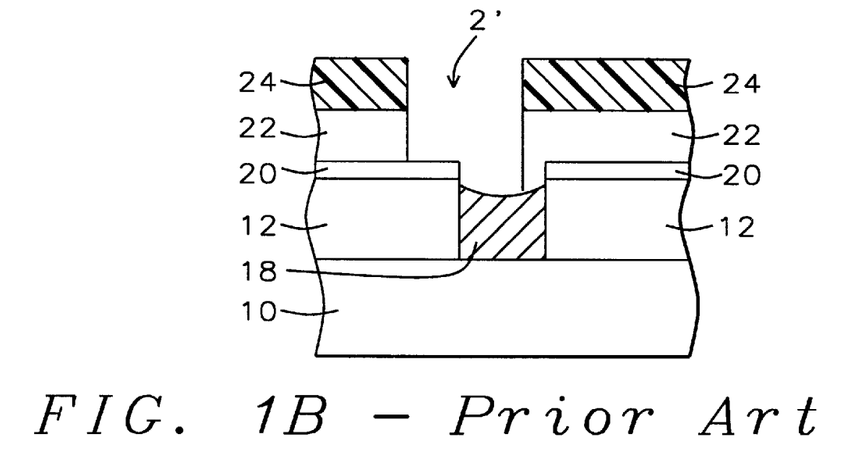

One conventional method to achieve a high density of memory cells on a DRAM chip is to form a capacitor node contact to one of the source/drain areas of the FET in each of the memory cells, and then to form a bottom electrode aligned over the node contact. In the next generation of semiconductor technology, the minimum feature sizes will be 0.25 micrometers or less. At these feature sizes, misalignment of the bottom electrode to the node contact can result in processing and reliability problems. One of these problems is best illustrated in the prior art depicted in FIGS. 1A through 3B. FIG. 1A shows a typical memory cell area on a substrate 10 having a silicon oxide ($SiO_2$) first insulating layer 12 and a silicon nitride ($Si_3N_4$) etch-stop layer 20. A patterned photoresist mask (not shown) and plasma etching are used to etch first openings 1 in layers 12 and 20 for node contacts. A doped first polysilicon layer is deposited and etched back to form the capacitor node contact 18 in opening 1. Because of variations in etch rate uniformities across the substrate, and because of nonuniformity in the polysilicon deposition, it is necessary to overetch for forming the polysilicon plugs for the node contacts to ensure that all the polysilicon is removed from the surface of the etch-stop layer 20. This results in recessed polysilicon plugs that expose the sidewalls of the first insulating layer 12. A disposable second insulating layer 22 is deposited, and a second photoresist mask 24 and plasma etching are used to etch second openings 2 in layer 22 for forming the capacitor bottom electrode, as shown in FIG. 1A. However, because of the difficulty of aligning the images for high-density circuits, the photoresist 24 for making the second opening 2' can be misaligned to the node contact 18, as shown in FIG. 1B.

Figure 2A:
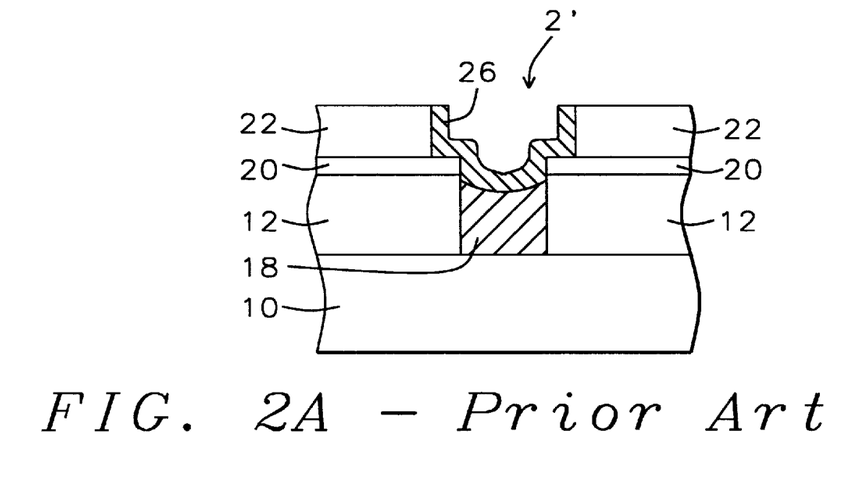
Figure 2B:
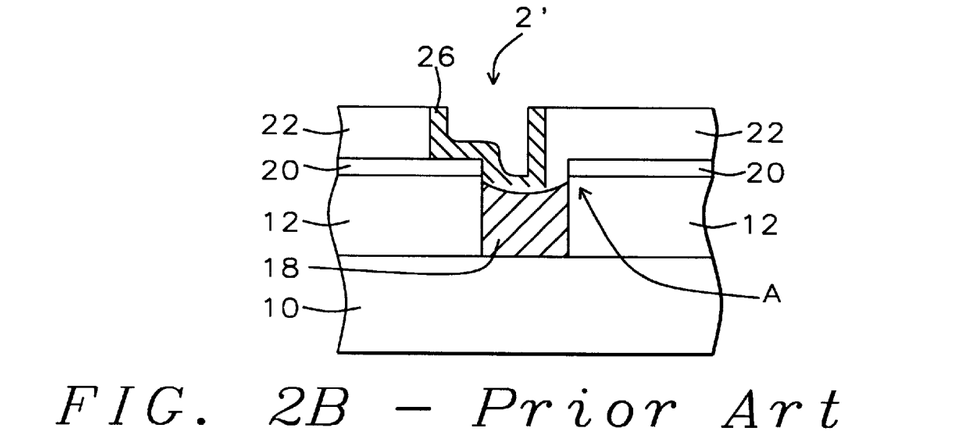

Referring to FIGS. 2A and 2B, a conformal second polysilicon layer is deposited and polished back to form the capacitor bottom electrode 26. As shown in FIG. 2B for the misaligned opening 2', the disposable second insulating layer 22 is adjacent to and in contact with the first insulating layer 12 at point A.

Figure 3A:
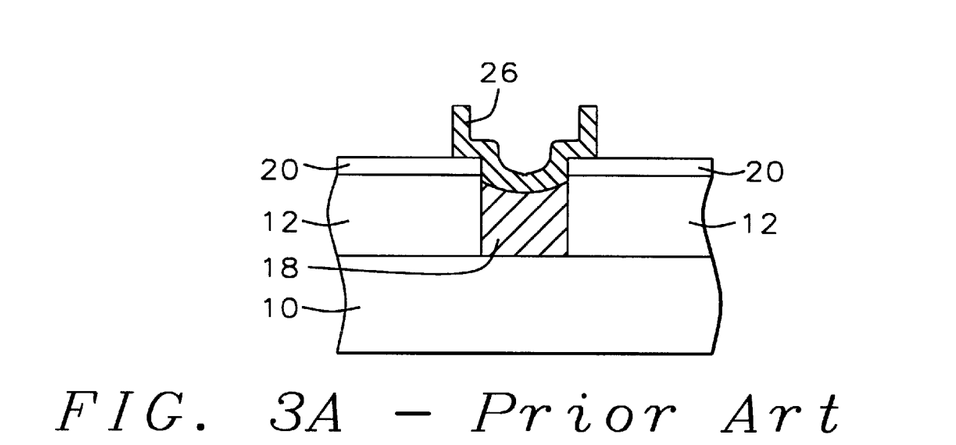
Figure 3B:
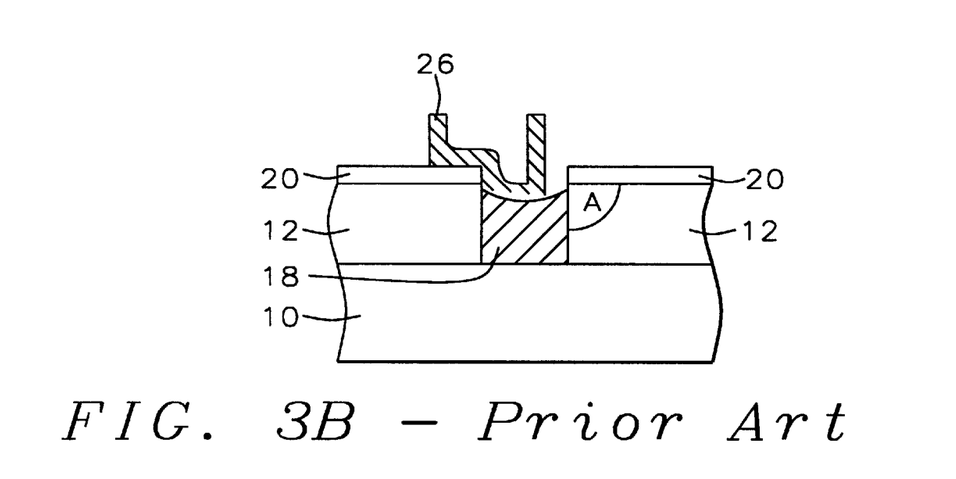

Now, as shown in FIG. 3A, the disposable $SiO_2$ second insulating layer 22 is removed using a wet etch, such as a hydrofluoric acid solution. The $Si_3N_4$ etch-stop layer 20 prevents the etchant from attacking the first insulating layer 12 over the devices on the substrate. However, as shown in FIG. 3B for the misaligned opening 2' for the bottom electrode, when the second insulating layer 22 is etched, the first insulating layer 12 is also etched or eroded away at the point A, which can cause electrical shorts and other reliability problems. Therefore, it is desirable to modify the conventional method to prevent this oxide erosion problem.

There are numerous methods of making DRAM circuits with stacked capacitors that are reported in the literature. Several methods for making DRAM capacitors are cited below, but do not address this misalignment problem. Fazan, in U.S. Pat. No. 5,478,772 forms a stacked capacitor compatible with high-dielectric constant materials. In a second patent to Fazan et al., U.S. Pat. No. 5,281,549, a method for making an I-shaped stacked capacitor for maximizing surface area is described. Matthews et al., in U.S. Pat. No. 5,354,705, describe a method for making a stacked capacitor with rough inner and outer surfaces for increased capacitance. Jones et al., in U.S. Pat. No. 5,405,796, teach a method for making improved capacitors using advanced materials, such as ferroelectric materials or a high-permittivity dielectric.

Therefore, there is still a need to improve upon the conventional method for fabricating reliable DRAM capacitors on memory cells.

SUMMARY OF THE INVENTION

It is a principal object of the present invention to provide a method for making memory cells on DRAM devices with improved cylinder-shaped stacked capacitors having increased capacitance.

It is another object of this invention to provide a method using an etch-stop layer to prevent erosion of an underlying silicon oxide ($SiO_2$) over the devices on the substrate. The etch-stop layer protects the sidewalls of the $SiO_2$ layer in the capacitor node contact openings when a disposable overlying $SiO_2$ layer, used to form the capacitor bottom electrodes, is removed in an isotropic wet etch.

Still another object of this invention is to provide a method that does not require additional processing steps over the conventional method, and therefore is a cost-effective manufacturing process.

The invention begins by providing a semiconductor substrate (wafer) composed of single crystalline silicon. The details for the semiconductor devices in the substrate are not explicitly described in detail since they are not essential to understanding the invention. But typically the memory cells on a substrate for DRAM circuits have device areas surrounded and electrically isolated by field oxide (FOX) regions and semiconductor devices such as field effect transistors (FETs) in the device areas. A cylinder-shaped storage capacitor is then formed over each of the memory cell areas to one of the device contact areas using a polysilicon plug as the capacitor node contact.

Continuing with the process, the method for making these improved cylinder-shaped capacitors using this modified method to avoid silicon oxide erosion when misalignment of the capacitor to the polysilicon plug (node contact) occurs is described. A first insulating layer is deposited on the substrate, which is then planarized. The first insulating layer is a silicon oxide ($SiO_2$) or a doped oxide such as a borophosphosilicate glass (BPSG). First openings are etched for capacitor node contacts in the first insulating layer to the device areas. A conductively doped first polysilicon layer is deposited to fill the first openings, and is etched back to form polysilicon plugs in the first openings. Unfortunately, it is difficult to consistently etch back the polysilicon because of run-to-run process variations, and because of non-uniform etch rates across the wafer. This overetching results in recessed polysilicon plugs exposing the sidewalls of the $SiO_2$ first insulating layer in the first openings. Then at subsequent steps if misalignment occurs, the exposed $SiO_2$ can be inadvertently etched.

By the method of this invention, a conformal etchstop layer, preferably composed of silicon nitride ($Si_3N_4$), is deposited on the substrate and over the polysilicon plugs in the first openings. The etch-stop layer protects the exposed sidewalls of the first insulating layer in those openings where the polysilicon plugs are overetched. A second insulating layer is deposited on the etch-stop layer. Second openings, that are wider than the first openings, are etched in the second insulating layer and in the etch-stop layer over and to the polysilicon plugs. Because of the more critical design rules for aligning the photoresist mask for the second openings, misalignment of the second opening to the first opening can occur. In the conventional process, the etch-stop layer is deposited prior to forming the first openings, and therefore does not protect the $SiO_2$ sidewalls in the first openings when the polysilicon plugs are unintentionally overetched. In the current invention, the etch-stop layer protects the $SiO_2$ sidewalls during subsequent etching. Next, a conformal second polysilicon layer is deposited over and in the second openings and is polished back to form bottom electrodes in the second openings. The disposable second insulating layer is then isotropically and selectively etched to the etch-stop layer to leave free-standing bottom electrodes. When the second openings are misaligned to the first openings, the etch-stop layer on the sidewalls of the first insulating layer protects the first insulating layer from etching when the disposable second insulating layer is removed. The DRAM capacitors are now completed by depositing an interelectrode dielectric layer on the bottom electrodes, and then depositing and patterning a third polysilicon layer to form top electrodes for the cylinder-shaped capacitors.

BRIEF DESCRIPTION OF THE DRAWINGS

The objects and other advantages of this invention are best understood in the preferred embodiment with reference to the attached drawings, which are now briefly described.

FIGS. 1A through 3B are schematic cross-sectional views showing the sequence of process steps that result in oxide erosion on conventional DRAM capacitors when misalignment occurs.

FIGS. 4 through 12 are schematic cross-sectional views showing the sequence of process steps for making a modified DRAM capacitor by the method of this invention, which eliminates the oxide erosion problem.

DESCRIPTION OF THE PREFERRED EMBODIMENT

Now in keeping with the objects of the present invention, the method for forming the cylinder-shaped storage capacitors is covered in detail. These improved capacitors can be used on DRAM circuits having FET structures that are currently utilized in the manufacture of DRAMs. Therefore, only those details of the underlying substrate structure will be described that are necessary for understanding the current invention for making these improved capacitors. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the chip.

Figure 4:
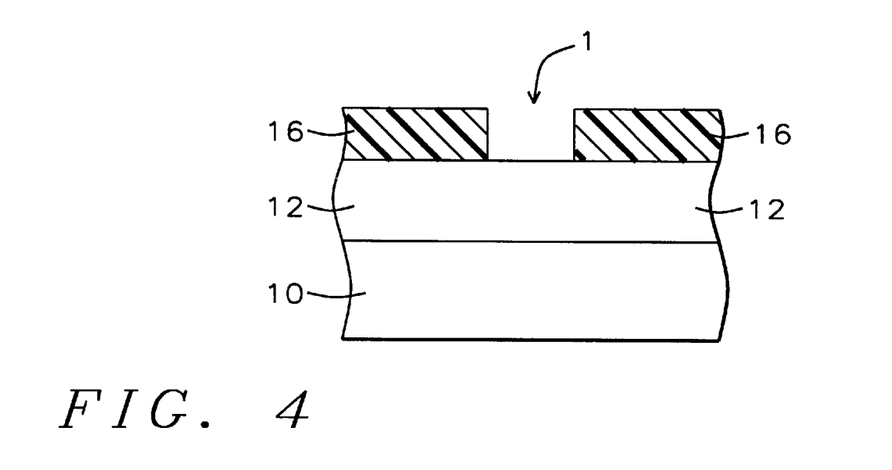

Referring now to FIG. 4, a cross-sectional view is shown of a portion of a substrate 10 having a partially completed DRAM cell. The preferred substrate is composed of a P-type single-crystal silicon with a <100> crystallographic orientation. The details for the semiconductor devices in and on the substrate are not explicitly depicted in the drawings and are not described in detail since they are fabricated as commonly practiced in the industry and are not essential for understanding the invention. However, the memory cells on a substrate for DRAM circuits typically have device areas surrounded and electrically isolated by field oxide (FOX) regions and semiconductor devices such as field effect transistors (FETs) in the device areas. A storage capacitor is then formed over each of the memory cell areas to one of the device contact areas using a polysilicon plug as the node contact.

Still referring to FIG. 4, the method for making the improved cylinder-shaped capacitors is now described. Only one of the array of capacitors is depicted in the drawings. A first insulating layer 12 is deposited on the substrate to insulate the semiconductor devices (not shown) on the substrate 10. Layer 12 is preferably $SiO_2$, and is deposited using LPCVD and a reactant gas such as tetraethosiloxane (TEOS). Alternatively, layer 12 can be a borophosphosilicate glass (BPSG) deposited by LPCVD using TEOS, and is doped with boron and phosphorus during the silicon oxide deposition. The first insulating layer 12 is then planarized. For example, layer 12 can be planarized using chemical/mechanical polishing (CMP) to provide global planarization. Alternatively, if a BPSG is used, the layer can be leveled by thermal annealing. The thickness of layer 12 after planarizing is preferably between about 500 and 5000 Angstroms over the underlying semiconductor devices on the substrate 10. Conventional photolithographic techniques are used to make a photoresist mask 16 for etching first contact openings.

Figure 5:
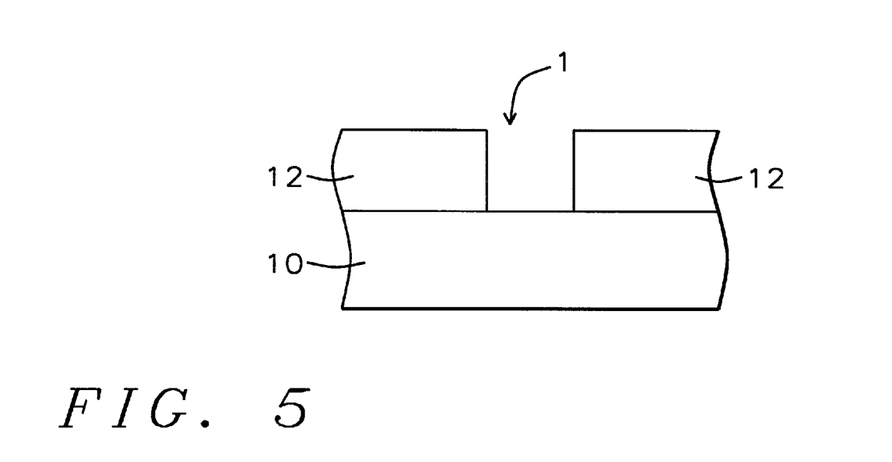

Referring to FIG. 5, first openings 1 are etched in the first insulating layer 12 over the device areas (memory cell areas) on the substrate 10 for capacitor node contacts. Preferably the etching is an anisotropic plasma etching carried out in a high-density plasma (HDP) etcher using an etchant gas mixture such as carbon tetrafluoride ($CF_4$), trifluoromethane ($CHF_3$), nitrogen ($N_2$), and argon (Ar) as the carrier gas having a high etch-rate selectivity of $SiO_2$ to silicon. The photoresist mask is then removed, for example, by plasma ashing in oxygen ($O_2$).

Figure 6:
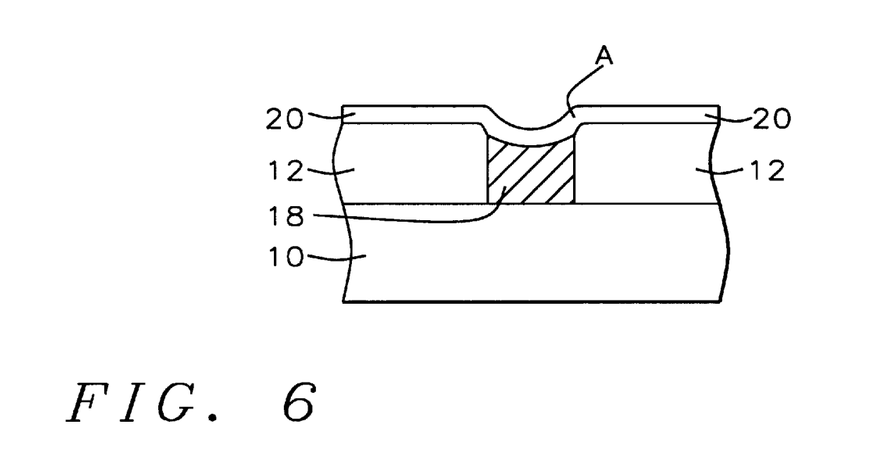

Referring to FIG. 6, a conformal first polysilicon layer 18 is deposited and is etched back to form polysilicon plugs 18 in the first openings 1. Layer 18 is preferably deposited by LPCVD using, for example, silane ($SiH_4$) as the reactant gas, and is in-situ doped with an N type dopant such as phosphorus to a concentration of between 1.0 E 19 and 1.0 E 21 atoms/cm³. Layer 18 is deposited to a thickness sufficient to fill the first contact openings 1 and more specifically to a thickness of between about 2000 and 5000 Angstroms.

Unfortunately, the variations in the deposition thickness of the polysilicon layer 18 across the substrate and the variations in etching back across the substrate and from run to run makes it difficult to consistently etch back each polysilicon plug 18 to the top surface of first insulating layer 12 without overetching some of the plugs, as depicted in FIG. 6 for one of the overetched plugs. This overetching exposes a portion A of the sidewalls of the $SiO_2$ first insulating layer 12 in the first openings 1. This exposure can cause erosion of the $SiO_2$ first insulating layer in subsequent processing steps of the conventional process when misalignment occurs at the next level of processing. To avoid this erosion problem, the method of this invention utilizes an etch-stop layer 20, which is conformally deposited over the first insulating layer 12 and over the polysilicon plugs 18 and over the portions A of the exposed sidewalls in the first opening 1, as depicted in FIG. 6. Layer 20 is preferably composed of silicon nitride ($Si_3N_4$) and is deposited by LPCVD using, for example, a reactant gas mixture such as dichlorosilane ($SiCl_2H_2$) and ammonia ($NH_3$), and is deposited to a preferred thickness of between about 50 and 1000 Angstroms.

Figure 7A:
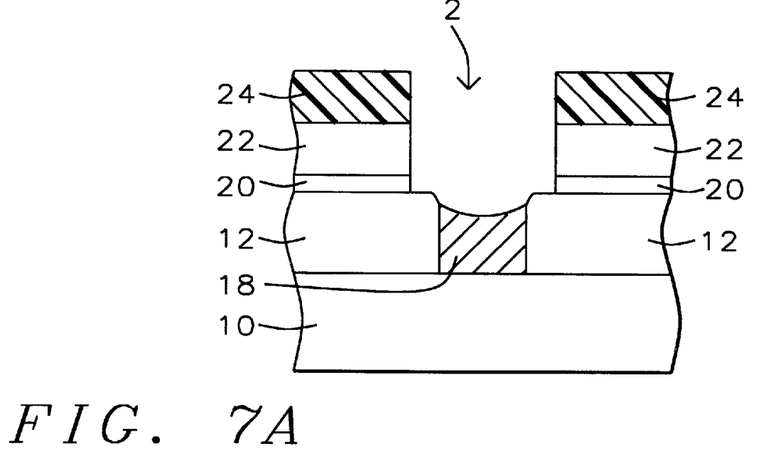
Figure 7B:
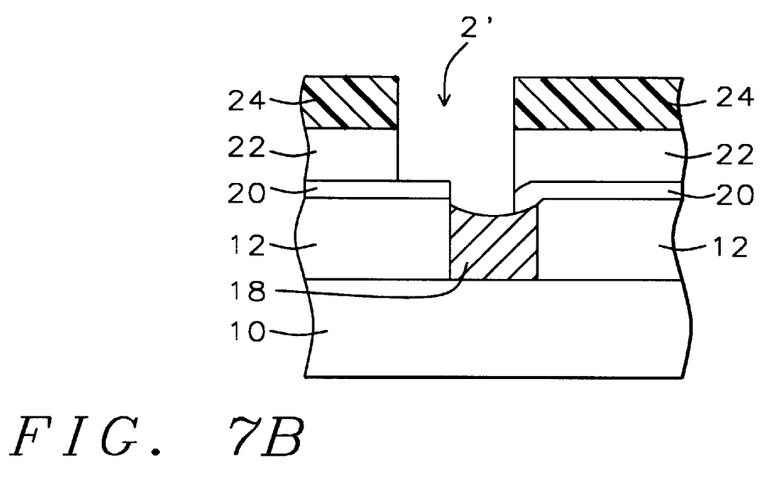

Referring now to FIGS. 7A and 7B, the process is depicted for making the capacitor bottom electrodes for an aligned and a misaligned capacitor, respectively. As shown in FIG. 7A, after depositing the etch stop layer 20, a blanket second insulating layer 22 is deposited. Layer 22 is preferably a silicon oxide layer deposited by LPCVD using a reactant gas mixture of $TEOS/O_3$, and is deposited to a thickness of between about 3000 and 18000 Angstroms. A photoresist mask 24 is patterned and anisotropic plasma etching is used to form second openings 2 in the second insulating layer 22 and the etch-stop layer 20 to the polysilicon plugs 18, as shown in FIG. 7A for the aligned second opening 2 and as shown in FIG. 7B for the misaligned second opening 2'. The etching is preferably carried out using a high-density plasma (HDP) etcher and etches $SiO_2$ and $Si_3N_4$ selectively to the polysilicon plug 18. For example, the etching can be achieved using an etchant gas mixture such as $CF_4$, $CHF_3$, $N_2$, and Ar as the carrier gas. As is evident in FIG. 7B for the misaligned opening, the etch-stop layer 20 is retained on the sidewall of layer 12 under the second insulating layer 22.

Figure 8A:
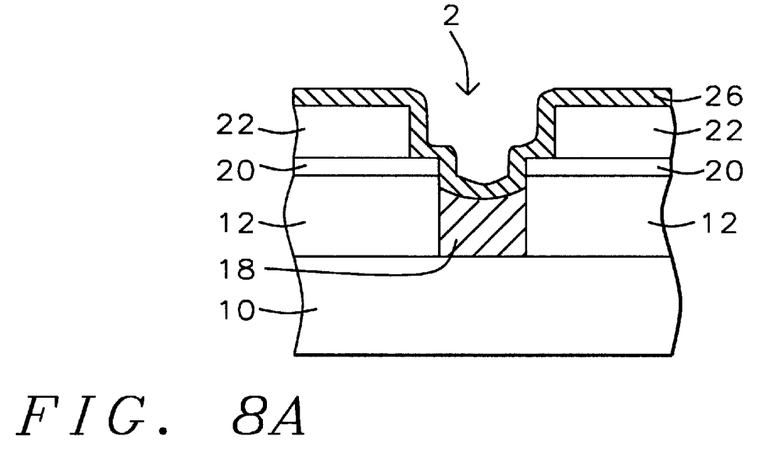
Figure 8B:
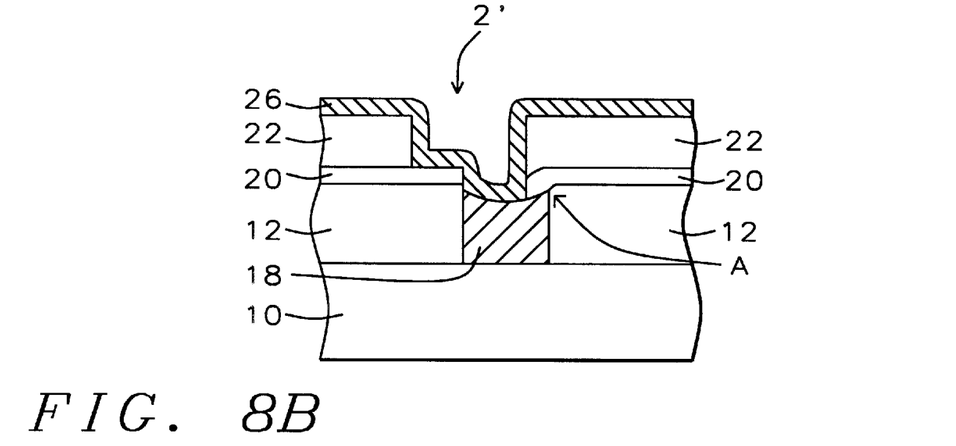

Referring to FIGS. 8A and 8B, after removing the photoresist mask 24, for example by plasma ashing in oxygen, a conformal second polysilicon layer 26 is deposited over the second insulating layer 22 and in the aligned second openings 2 and in the misaligned second openings 2', making electrical contact to the polysilicon plugs 18. Preferably polysilicon layer 26 is deposited by LPCVD using, for example, $SiH_4$, and is in-situ doped with phosphorus to a concentration of between about 1.0 E 19 and 1.0 E 21 atoms/cm$^3$. Layer 26 is deposited to a thickness of between about 300 and 2000 Angstroms.

Figure 9A:
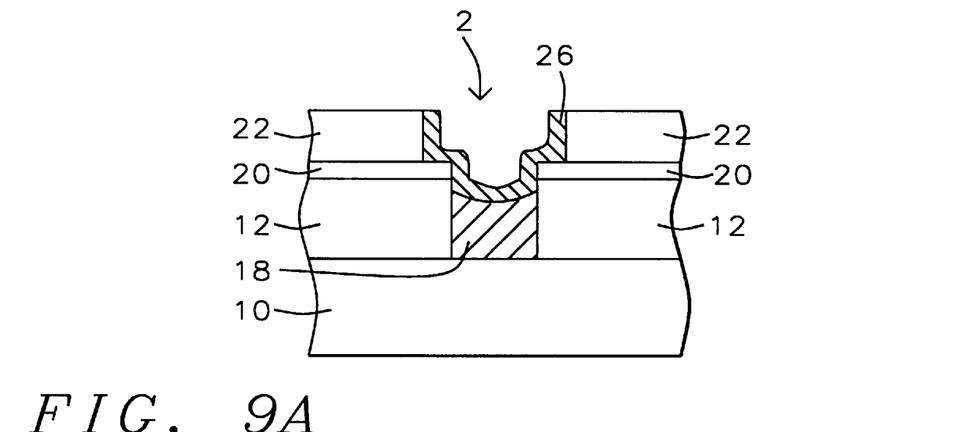
Figure 9B:
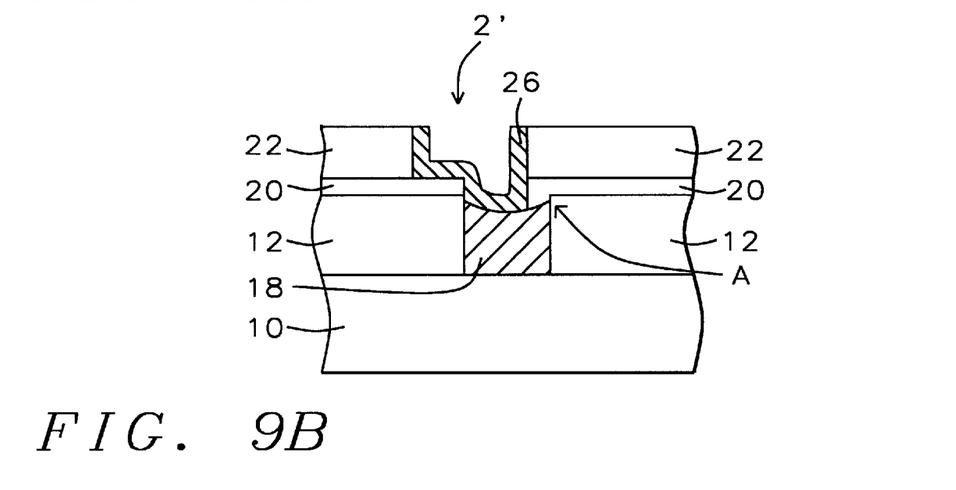

As shown now in FIGS. 9A and 9B, the second polysilicon layer 26 is chemically/mechanically polished back to form capacitor bottom electrodes, also labeled 26, in the second openings 2 and 2'.

Figure 10A:
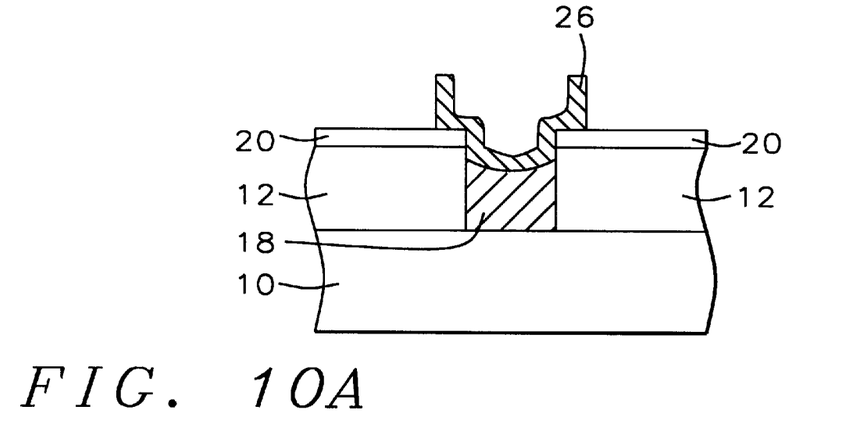
Figure 10B:
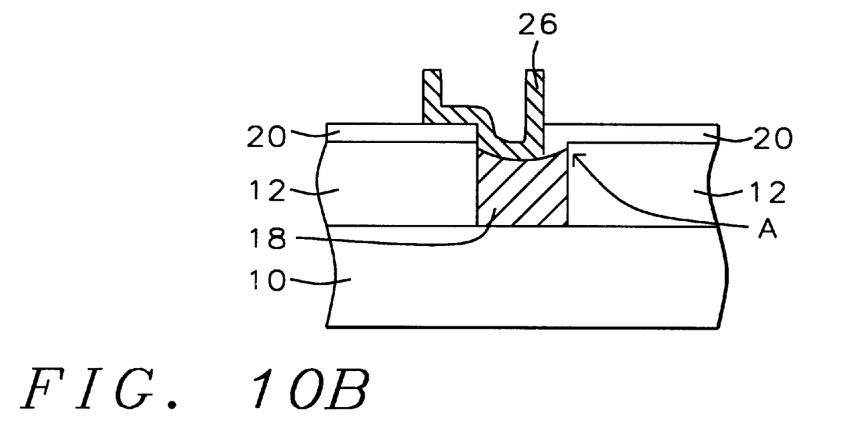

Referring to FIGS. 10A and 10B, the disposable $SiO_2$ second insulating layer 22 is then isotropically etched to the etch-stop layer 20 to leave free-standing bottom electrodes 26. The etching is carried out preferably using a hydrofluoric (HF) acid solution. A key feature of this invention as depicted in FIG. 10B, is that the etch-stop layer 20 on the sidewall of the first insulating layer 12 at point A is retained and prevents erosion of layer 12 when the disposable $SiO_2$ second insulating layer is removed. This is an improvement over the prior art depicted in FIG. 2B, in which the removal of the disposable $SiO_2$ insulating layer 22 will result in the erosion of the first insulating layer 12 in the exposed area A, as depicted in FIG. 3B, which can result in unreliable device structures.

Figure 11:
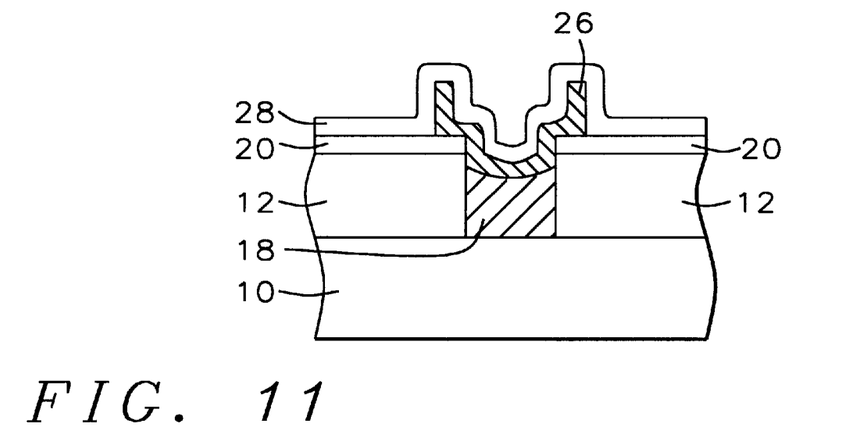

As shown in FIG. 11, the DRAM cylindrical capacitors are now completed by depositing an interelectrode dielectric layer 28 on the bottom electrodes 26, and forming the capacitor top electrodes by depositing and patterning a third polysilicon layer 30. Only the aligned structure is shown since the process steps are the same on the misaligned capacitors. The interelectrode dielectric layer 28 is formed on the surface of the bottom electrodes. The dielectric layer 28 is preferably between about 30 and 200 Angstroms thick, and is composed of a material having a high dielectric constant that is compatible with the polysilicon processing, and is continuous and pin-hole free. The preferred interelectrode dielectric layer is composed of silicon oxide-silicon nitride (ON) or a silicon oxide-silicon nitride-silicon oxide (ONO) layer. For example, the surface of the polysilicon bottom electrode 26 can be thermally oxidized to form the $SiO_2$, and then a thin conformal $Si_3N_4$ layer can be deposited using LPCVD to form the ON layer. To form the ONO layer, the exposed surface of the $Si_3N_4$ layer can then be reduced in an oxidizing ambient at elevated temperatures. Additionally, the surface of the polysilicon bottom electrodes 26 can be roughened to further increase the surface area and the capacitance. Other high-dielectric constant insulators can also be used, such as tantalum pentoxide ($Ta_2O_5$) and the like.

Figure 12:
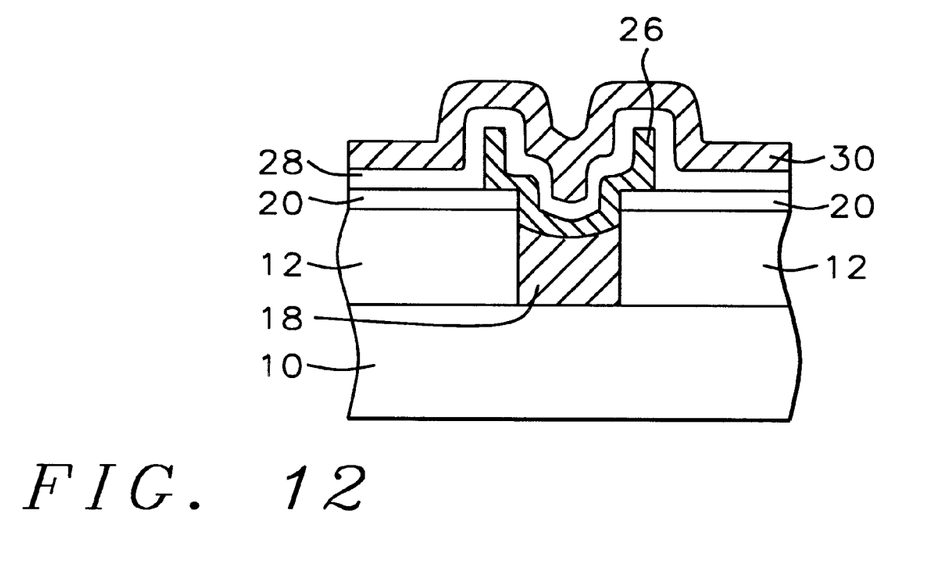

Still referring to FIG. 12, the third polysilicon layer 30 is deposited over the interelectrode dielectric layer 28, and is then patterned using conventional photolithographic and plasma etching techniques to form the top electrodes 30. The third polysilicon layer 30 is preferably deposited by LPCVD to a thickness of between about 500 and 2000 Angstroms, and is in-situ doped with an N-type dopant, such as phosphorous (P), having a preferred concentration in the range of between about 1.0 E 19 and 1.0 E 21 atoms/cm$^3$.

While the invention has been particularly shown and described with reference to the preferred embodiment thereof, it will be understood by those skilled in the art that various changes in form and detail may be made without departing from the spirit and scope of the invention.

What is claimed is:

1. A method for fabricating stacked capacitors for memory devices comprising the steps of:

providing a semiconductor substrate having device areas with semiconductor devices;

forming a planar first insulating layer over said device areas on said substrate;

selectively etching first openings for capacitor node contacts in said first insulating layer to said device areas;

depositing a conductively doped first polysilicon layer to fill said first openings, and etching back said first polysilicon layer to form polysilicon plugs in said first openings;

depositing a blanket etch-stop layer on said first insulating layer and over said polysilicon plugs in said first openings and over the sidewalls of any exposed said first insulating layer when said polysilicon plugs are overetched;

depositing a second insulating layer on said etch-stop layer;

selectively etching second openings, over and wider than said first openings, in said second insulating layer and in said etch-stop layer to said polysilicon plugs;

depositing a conformal second polysilicon layer over and in said second openings and contacting said polysilicon plugs;

polishing back said second polysilicon layer to said second insulating layer to form bottom electrodes in said second openings;

isotropically etching said second insulating layer selectively to said etch-stop layer to leave free-standing said bottom electrodes, while said etch-stop layer on said sidewalls of said first insulating layer protect said first insulating layer from etching when said second openings are misaligned to said first openings;

depositing an interelectrode dielectric layer on said bottom electrodes;

depositing and patterning a third polysilicon layer to form top electrodes and completing said stacked capacitors.

2. The method of claim 1, wherein said first insulating layer is silicon oxide, and has a thickness of between about 500 and 5000 Angstroms after planarizing.

3. The method of claim 1, wherein said first polysilicon layer is doped with conductive impurities to a concentration of between about 1.0 E 17 and 1.0 E 21 atoms/cm$^3$, and is deposited to a thickness of between about 2000 and 5000 Angstroms.

4. The method of claim 1, wherein said etch-stop layer is silicon nitride and has a thickness of between about 50 and 1000 Angstroms.

5. The method of claim 1, wherein said second insulating layer is silicon oxide and is deposited to a thickness of between about 3000 and 18000 Angstroms.

6. The method of claim 1, wherein said second polysilicon layer is conductively doped in-situ to a concentration of between about 1.0 E 19 and 1.0 E 21 atoms/cm$^3$, and is deposited to a thickness of between about 300 and 2000 Angstroms.

7. The method of claim 1, wherein said isotropic etching of said second insulating layer is carried out in a hydrofluoric acid solution.

8. The method of claim 1, wherein said interelectrode dielectric layer is silicon oxide/silicon nitride/silicon oxide (ONO), and has a thickness of between about 30 and 200 Angstroms.

9. The method of claim 1, wherein said third polysilicon layer is doped with conductive impurities to a concentration of between about 1.0 E 19 and 1.0 E 21 atoms/cm$^3$, and has a thickness of between about 500 and 2000 Angstroms.

10. A method for fabricating stacked capacitors for memory devices comprising the steps of:

providing a semiconductor substrate having device areas with semiconductor devices;

forming a planar first insulating layer over said device areas on said substrate;

selectively etching first openings for capacitor node contacts in said first insulating layer to said device areas;

depositing a conductively doped first polysilicon layer to fill said first openings, and etching back said first polysilicon layer to form polysilicon plugs in said first openings;

depositing a blanket etch-stop layer, composed of silicon nitride, on said first insulating layer and over said polysilicon plugs in said first openings and over the sidewalls of any exposed said first insulating layer when said polysilicon plugs are overetched;

depositing a second insulating layer on said etch-stop layer;

selectively etching second openings, over and wider than said first openings, in said second insulating layer and in said etch-stop layer to said polysilicon plugs;

depositing a conformal second polysilicon layer over and in said second openings and contacting said polysilicon plugs;

polishing back said second polysilicon layer to said second insulating layer to form bottom electrodes in said second openings;

isotropically etching said second insulating layer selectively to said etch-stop layer to leave free-standing said bottom electrodes, while said etch-stop layer on said sidewalls of said first insulating layer protect said first insulating layer from etching when said second openings are misaligned to said first openings;

depositing an interelectrode dielectric layer on said bottom electrodes;

depositing and patterning a third polysilicon layer to form top electrodes and completing said stacked capacitors.

11. The method of claim 10, wherein said first insulating layer is silicon oxide, and has a thickness of between about 500 and 5000 Angstroms after planarizing.

12. The method of claim 10, wherein said first polysilicon layer is doped with conductive impurities to a concentration of between about 1.0 E 17 and 1.0 E 21 atoms/cm$^3$, and is deposited to a thickness of between about 2000 and 5000 Angstroms.

13. The method of claim 10, wherein said etch-stop layer has a thickness of between about 50 and 1000 Angstroms.

14. The method of claim 10, wherein said second insulating layer is silicon oxide and is deposited to a thickness of between about 3000 and 18000 Angstroms.

15. The method of claim 10, wherein said second polysilicon layer is conductively doped in-situ to a concentration of between about 1.0 E 19 and 1.0 E 21 atoms/cm$^3$, and is deposited to a thickness of between about 300 and 2000 Angstroms.

16. The method of claim 10, wherein said isotropic etching of said second insulating layer is carried out in a hydrofluoric acid solution.

17. The method of claim 10, wherein said interelectrode dielectric layer is silicon oxide/silicon nitride/silicon oxide (ONO), and has a thickness of between about 30 and 200 Angstroms.

18. The method of claim 10, wherein said third polysilicon layer is doped with conductive impurities to a concentration of between about 1.0 E 19 and 1.0 E 21 atoms/cm$^3$, and has a thickness of between about 500 and 2000 Angstroms.

* * * * *